United States Patent
Ek

(10) Patent No.: US 9,634,560 B2
(45) Date of Patent: Apr. 25, 2017

(54) VOLTAGE MODULATOR

(71) Applicant: Telefonaktiebolaget L M Ericsson (publ), Stockholm (SE)

(72) Inventor: Staffan Ek, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 35 days.

(21) Appl. No.: 14/779,108

(22) PCT Filed: Feb. 11, 2014

(86) PCT No.: PCT/EP2014/052664
§ 371 (c)(1),
(2) Date: Sep. 22, 2015

(87) PCT Pub. No.: WO2014/154390
PCT Pub. Date: Oct. 2, 2014

(65) Prior Publication Data
US 2016/0056714 A1  Feb. 25, 2016

(30) Foreign Application Priority Data

Mar. 26, 2013 (EP) .................................. 13161136

(51) Int. Cl.
*H02M 3/158* (2006.01)
*H02M 3/07* (2006.01)
(Continued)

(52) U.S. Cl.
CPC ............. *H02M 3/07* (2013.01); *H02M 3/158* (2013.01); *H02M 3/1584* (2013.01); *H03F 3/20* (2013.01);
(Continued)

(58) Field of Classification Search
CPC ........ H02M 1/08; H02M 1/088; H02M 3/156; H02M 3/1584; H02M 2003/1584
(Continued)

(56) References Cited

U.S. PATENT DOCUMENTS 6,639,462 B1    10/2003 Luu
7,492,134 B2 *  2/2009 Tang ................... H02M 3/1584
                                              323/241

(Continued)

FOREIGN PATENT DOCUMENTS

EP    1852963 A1    11/2007
EP    2256579 A1    12/2010
EP    2493060 A1    8/2012

OTHER PUBLICATIONS

Amoroso, L. et al., "Single Shot Transient Suppressor (SSTS) for High Current High Slew Rate Microprocessor", Fourteenth Annual Applied Power Electronics Conference and Exposition, Mar. 14, 1999, pp. 284-288, vol. 1, IEEE.
(Continued)

*Primary Examiner* — Jeffrey Sterrett
(74) *Attorney, Agent, or Firm* — Coats & Bennett, PLLC

(57) ABSTRACT

A voltage modulator (400) comprises a multi-level switched capacitor modulator (44) connected in parallel with a switched voltage regulator (42). An output of the multi-level switched capacitor modulator and an output of the switched voltage regulator are combined, or both connected to an output node, to generate an output voltage. The voltage modulator has an input node to receive at least one input signal and further comprises a control unit (46) arranged to control the switched voltage regulator and the multi-level switched capacitor modulator such that the output voltage follows the input signal.

19 Claims, 14 Drawing Sheets

(51) Int. Cl.
*H03F 3/20* (2006.01)
*H04W 88/02* (2009.01)
*H02M 1/00* (2006.01)
*H02M 3/156* (2006.01)

(52) U.S. Cl.
CPC .... *H04W 88/02* (2013.01); *H02M 2001/0045* (2013.01); *H02M 2003/1566* (2013.01); *H03F 2200/504* (2013.01)

(58) Field of Classification Search
USPC .................................................. 323/272, 299
See application file for complete search history.

(56) References Cited

U.S. PATENT DOCUMENTS

| | | | |
|---|---|---|---|
| 2002/0030473 A1 | 3/2002 | Utsunomiya | |
| 2008/0012544 A1 | 1/2008 | Krein et al. | |
| 2012/0062205 A1 | 3/2012 | Levesque et al. | |
| 2014/0070787 A1* | 3/2014 | Arno | H02M 3/07 323/304 |
| 2016/0056714 A1* | 2/2016 | Ek | H02M 3/07 323/271 |
| 2016/0352219 A1* | 12/2016 | Amgad Abdulslam | H02M 1/08 |

OTHER PUBLICATIONS

Wu, P., et al., "A Two-Phase Switching Hybrid Supply Modulator for RF Power Amplifiers With 9% Efficiency Improvement", IEEE Journal of Solid-State Circuits, Dec. 1, 2010, pp. 2543-2556, vol. 45, No. 12, IEEE.

Kormann, B., et al., "High-Efficiency, Regulated Charge Pumps for High-Current Applications", Unitrode Design Seminar, Jan. 1, 2001, pp. 4-1-4-14.

Gong, G., et al., "A Multi-Cell Cascaded Power Amplifier", Twenty-First Annual IEEE Applied Power Electronics Conference and Exposition, Mar. 19, 2006, pp. 1550-1552, IEEE.

* cited by examiner

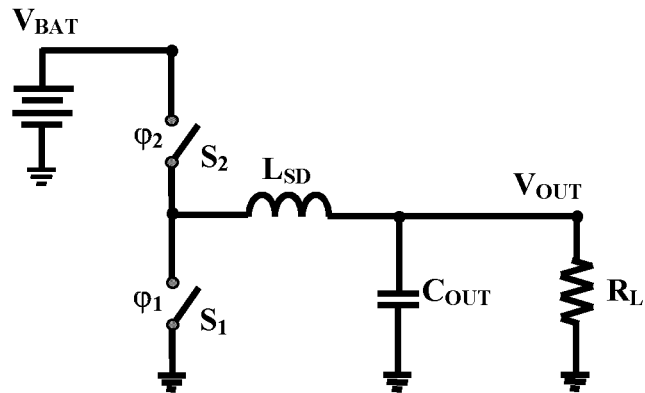
Fig. 1 Switched voltage regulator/buck converter
(Prior Art)
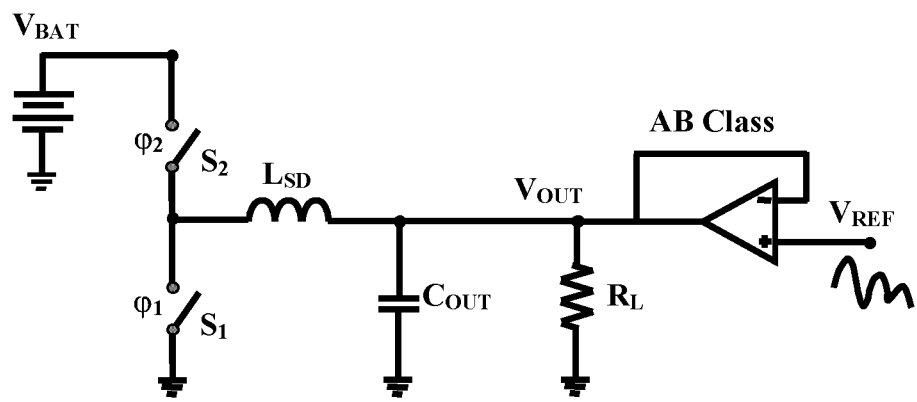
Fig. 2 Hybrid supply modulator
(Prior Art)

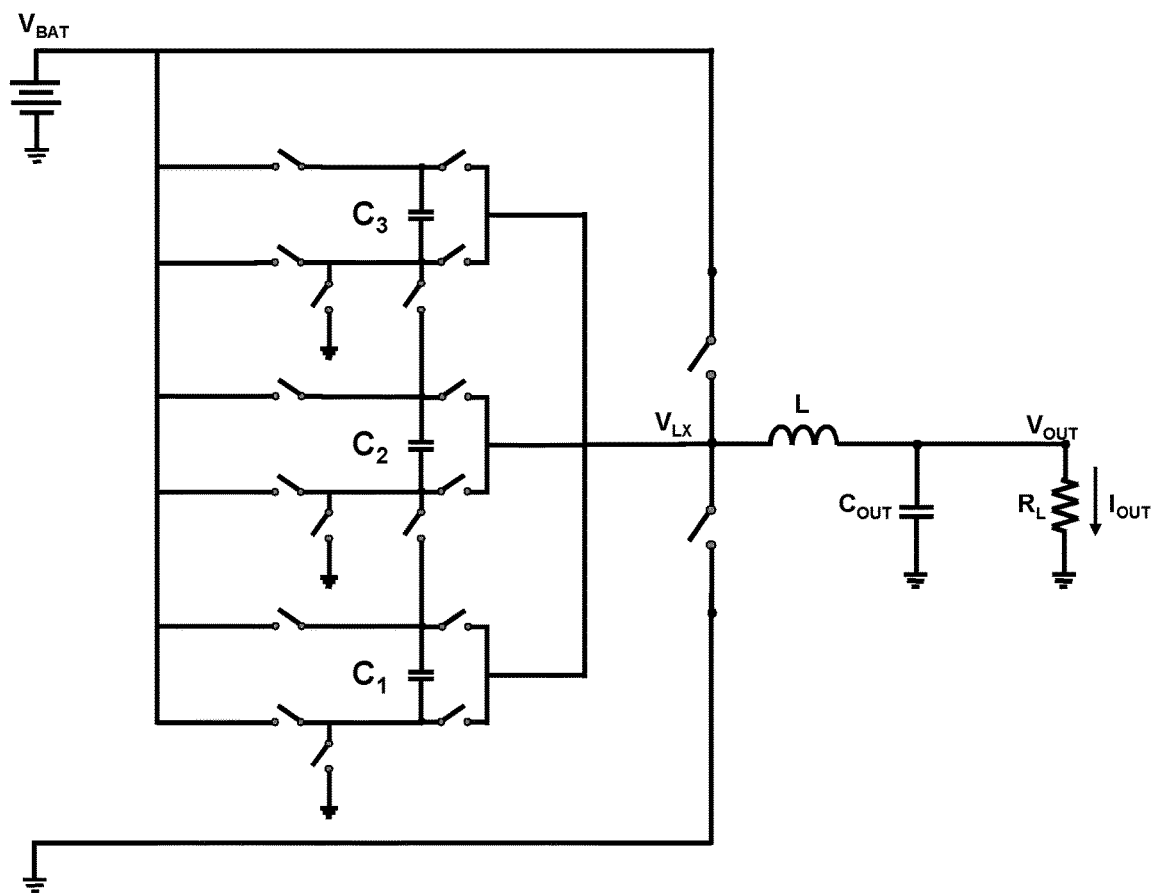
Fig. 3 Multi-level supply modulator
(Prior Art)

VOLTAGE MODULATOR

TECHNICAL FIELD

The present invention generally relates to devices and methods for generating an output voltage to follow an input signal, and particularly to a high bandwidth, high efficiency voltage modulator, for example, for envelope tracking for radio frequency power amplifiers.

BACKGROUND

The adoption of Orthogonal Frequency Division Multiplexing (OFDM) for transmitters in communication devices has reduced the efficiency of the linear power amplifiers (PAs), which causes a significant amount of the total energy consumption. This is due to the high peak-to-average power ratio (PAR) of the transmitted signal that OFDM results in. A means for improving the efficiency is to let the PA power supply follow the envelope of the transmitted signal. By doing this, the PA does not use more bias current than needed, regardless if the transmitted signal has a high or low momentary power.

Tracking the envelope of the transmitted signal requires a supply modulator which has sufficient bandwidth, in order not to distort the output signal, and high efficiency, in order not to loose what is gained in the improved PA efficiency. The two properties mentioned are difficult to combine as the switched voltage regulators (step-down (or buck)/step-up (or boost) DC-DC converters) often used, as depicted in FIG. 1, suffer from switching losses if they are switched quickly, which is required if the bandwidth is high.

The article Patrick Y. Wu et al "A two-phase switching hybrid supply modulator for RF power amplifiers with 9% efficiency improvement", IEEE J. Solid-State Circuits, vol. 45, no. 12, pp. 2543-2556, December 2010, describes a two-phase switching hybrid modulator, as depicted in FIG. 2, consisting of one slow, highly efficient buck converter supported by a linear modulator which has a high bandwidth. However, the linear modulator normally suffers from very poor efficiency which reduces the actual overall efficiency gained from tracking the envelope.

EP2493060A1 discloses a multi-level supply modulator, or Step-Up/Down converter, as depicted in FIG. 3. This multi-level supply modulator comprises a multi-level charge pump. Furthermore, this multi-level supply modulator comprises an LC-filter (L, $C_{OUT}$). Such a multi-level supply modulator is theoretically more efficient (than the hybrid modulator described above) as it does not use any linear modulator. However, of complexity reasons, the number of levels is limited. Therefore the switching speed still needs to be relatively high, which causes losses as described earlier. The losses occur when the gates of the switch transistors need to be charged and discharged while switched on and off. The losses become even more significant when large switches have to be used to carry large currents.

SUMMARY

An object of the present invention is to provide a voltage regulator with relatively high bandwidth and relatively high efficiency.

According to embodiments of the invention the object is achieved in a voltage modulator configured to generate an output voltage, comprising a multi-level switched capacitor modulator connected in parallel with a switched voltage regulator. An output of the multi-level switched capacitor modulator and an output of the switched voltage regulator are combined, or both connected to an output node, to generate the output voltage. The voltage modulator has an input node to receive at least one input signal and further comprises a control unit arranged to control the switched voltage regulator and the multi-level switched capacitor modulator such that the output voltage follows the input signal.

In one embodiment, the multi-level switched capacitor modulator comprises a storage capacitor. The storage capacitor is arranged to be charged when an output current is smaller than a current delivered by the switched voltage regulator. The storage capacitor is arranged to be discharged when the output current is larger than the current delivered by the switched voltage regulator.

In one embodiment, the control unit comprises a first control loop arranged to control switches of the switched voltage regulator such that voltage stored in the storage capacitor reaches a value set by a control signal. The first control loop may comprise a first error amplifier arranged to receive a voltage signal from the storage capacitor and the control signal and output an error signal representing a difference between the voltage signal and the control signal. Furthermore, the first control loop may comprise a comparator arranged to receive the error signal generated by the first error amplifier and a saw tooth signal to generate a pulse width modulation signal. Moreover, the first control loop may comprise a switch control signal generator arranged to generate switch control signals to the switched voltage regulator based on the pulse width modulation signal. The switch control signal generator may comprise inverters and delay stages configured to tune switching instants such that non-overlapping switching is achieved.

In one embodiment, the first control loop is configurable to operate at different bandwidths in different operation modes, for example start-up mode and normal operating mode.

In one embodiment, the control unit comprises a second control loop arranged to control switches of the multi-level switched capacitor modulator such that the output voltage follows the input signal. The second control loop may comprise a second error amplifier arranged to receive the input signal and the output voltage and to output an error signal representing a difference between the output voltage and the input signal. Furthermore, the second control loop may comprise a plurality of comparators, each arranged to receive the error signal generated by the second error amplifier and a saw tooth signal associated with the comparator and to generate a pulse width modulation signal. Moreover, the second control loop may comprise a switch control signal generator arranged to generate switch control signals to the multi-level switched capacitor modulator based on the pulse width modulation signals. The saw tooth signals associated with the different comparators may have different DC levels. The switch control signal generator may comprise delay stages configured to tune switching instants.

The switched voltage regulator may e.g. be a buck converter or a boost converter.

In one embodiment, the voltage modulator further comprises a load connected to the output node. An impedance of the load may be variable over time.

The multi-level switched capacitor modulator may be a charge-pump based multi-level switched capacitor modulator.

The multi-level switched capacitor modulator may comprise a multi-level charge pump.

It is also disclosed a method of generating an output voltage to follow an input signal. The method comprises combining an output of a switched voltage regulator and an output of a multi-level switched capacitor modulator to generate the output voltage. The method further comprises controlling, by a first control loop, switches of the switched voltage regulator such that a voltage stored in a storage capacitor of the multi-level switched capacitor modulator reaches a value set by a control signal. Furthermore, the method comprises controlling, by a second control loop, switches of the multi-level switched capacitor modulator such that the output voltage follows the input signal.

The multi-level switched capacitor modulator may be a charge-pump based multi-level switched capacitor modulator.

The multi-level switched capacitor modulator may comprise a multi-level charge pump.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which:

FIG. 1 is a schematic view of a switched voltage regulator/buck converter;

FIG. 2 is a schematic view of a hybrid supply modulator;

FIG. 3 is a schematic view of a multi-level supply modulator;

DETAILED DESCRIPTION

FIG. 2 shows a hybrid supply modulator combining a standard step-down converter (switched voltage regulator) with a linear regulator (using a class AB amplifier). As mentioned in the background, the efficiency of a hybrid modulator is limited by the linear regulator efficiency, which is an analogy to the limited linear PA efficiency at power back off. In particular, the efficiency becomes even lower if the linear regulator needs to sink current delivered from the step-down converter to ground in order to lower the output voltage.

By studying the multi-level supply modulator showed in FIG. 3, the inventor has realized that it can work also in a backward current direction. That is, the battery may not only deliver energy through the inductor to the load, but the load may also deliver energy in the opposite direction to the battery. By adding a basically constant current with the right value to the output node, the multi-level supply modulator can modulate the current delivered to the load and the current delivered to the battery in such a way that the average current delivered from the battery is zero. Ultimately, the multi-level part may be disconnected from the battery and the energy can be stored in a capacitor.

Figure 4:
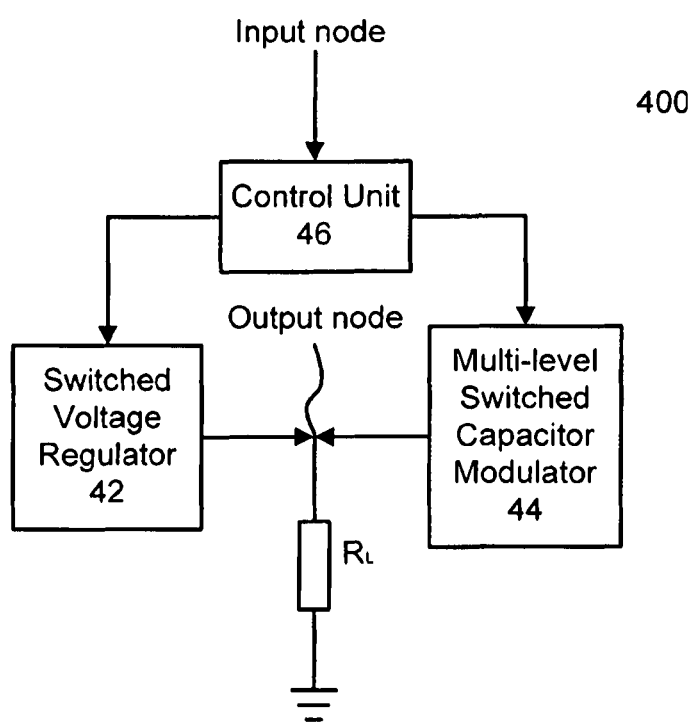
FIG. 4 is a block view of a voltage regulator according to an embodiment of the invention.

FIG. 4 shows a block view of a voltage regulator 400 according to an embodiment of the invention. The voltage regulator 400 comprises a "slow", high efficiency switched voltage regulator 42 (referred to also as "high efficiency regulator" in the discussion below) connected in parallel with a relatively high speed multi-level switched capacitor modulator 44 (referred to also as "high speed modulator" in the discussion below). An output of the multi-level switched capacitor modulator and an output of the switched voltage regulator are combined, or both connected to an output node, to provide an output voltage to the load $R_L$. The voltage modulator has an input node to receive at least one input signal comprising information on wanted output voltage and further comprises a control unit 46 arranged to control the switched voltage regulator and the multi-level switched capacitor modulator such that the output voltage follows (the wanted output voltage provided by said information of) the input signal.

Figure 5:
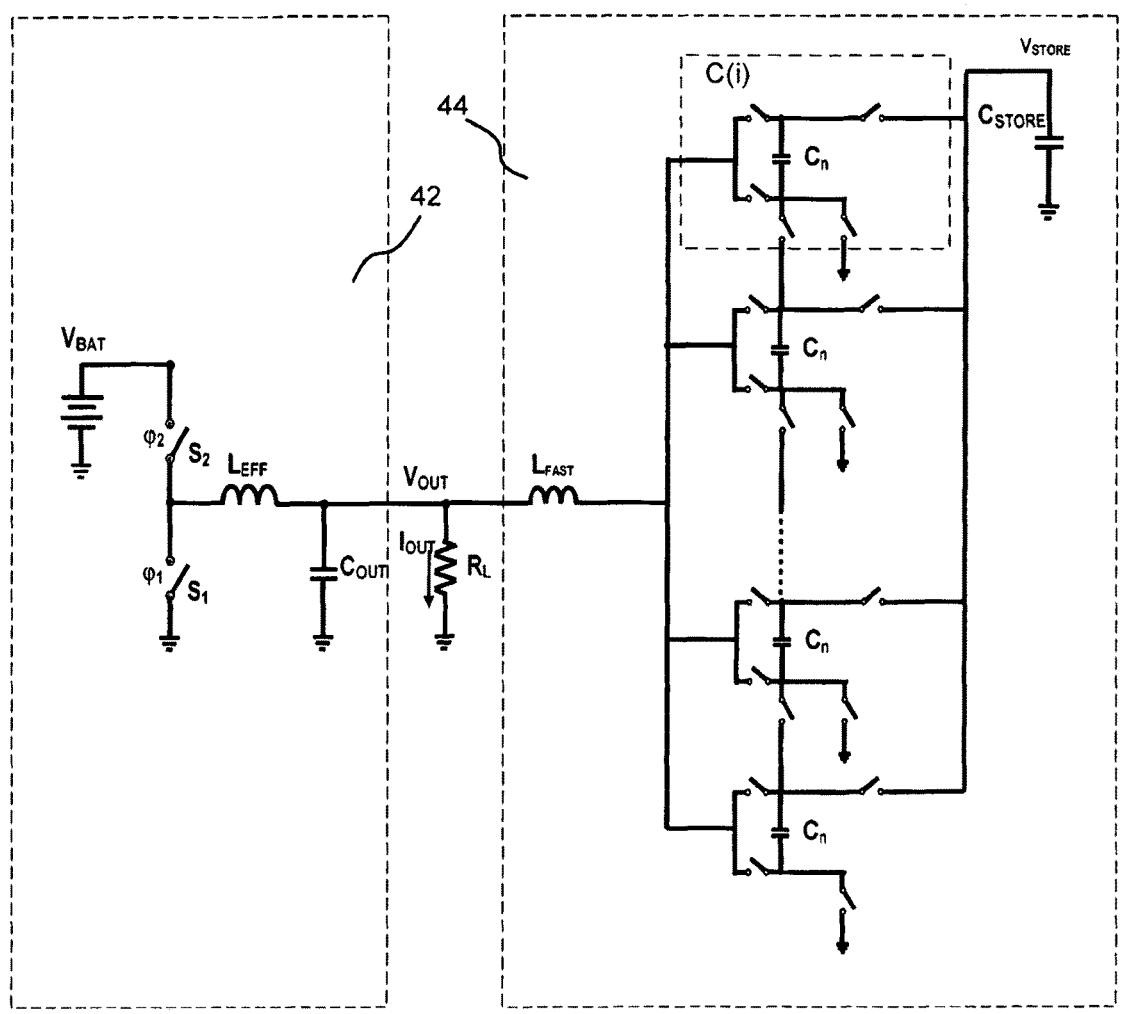
FIG. 5 is a schematic view of the voltage regulator in FIG. 4 without control unit.

FIG. 5 shows a schematic view of an embodiment of the voltage regulator in FIG. 4 without the control unit. In this embodiment, the slow, high efficiency switched voltage regulator 42 is a standard buck converter. Other types, such as a boost converter may be used as the slow, high efficiency switched voltage regulator in other embodiments. The output voltage of the converter is regulated by adjusting the duty cycles of clock signals $\phi1$ and $\phi2$ which control the two switches S1 and S2. The multi-level switched capacitor modulator 44 comprises a storage capacitor $C_{STORE}$ which has a voltage $V_{STORE}$ across it and is charged and discharged during operation. The multi-level switched capacitor modulator also comprises N capacitor arrays C(i) (i=1, . . . N), each comprising at least one capacitor Cn and a few switches, together forming a multi-level charge pump (compare e.g. FIG. 3 and EP2493060A1). Hence, according to embodiments of the present invention, the multi-level switched capacitor modulator 44 comprises a multi-level charge pump. Accordingly, in accordance with embodiments of the present invention, the multi-level switched-capacitor modulator 44 can be described as a charge-pump based multi-level switched-capacitor modulator 44. The number N of the capacitor arrays C(i) is depended on how many output voltage ranges are needed. For example, if 3 output voltage ranges are needed, N is 3, the output voltage ranges can then e.g. be 0-1/3$V_{STORE}$, 1/3$V_{STORE}$-2/3$V_{STORE}$ and 2/3$V_{STORE}$-Vstore.

The person skilled in the art will understand that capacitors $C_{STORE}$ and Cn may be implemented in any technology, or replaced by an assembly of components adapted to function as an indivisible capacitor. The assembly of components may comprise a group of smaller capacitors in series, in parallel, or even other electric or electronic components such as transistors etc.

Figure 6:
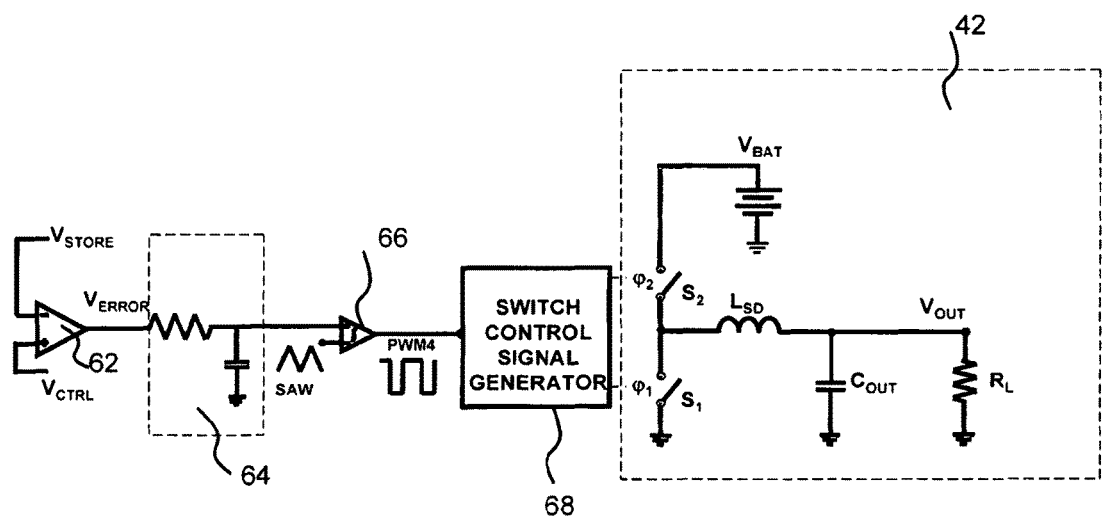
FIG. 6 is a schematic view of a switched voltage regulator with control circuitry according an embodiment of the invention.

FIG. 6 shows a schematic view of an embodiment of the switched voltage regulator 42 with control circuitry. According to the embodiment, the control circuitry, which is part of the control unit 46 in FIG. 4, comprises an error amplifier 62, a comparator 66 and a switch control signal generator 68. The error amplifier 62 receives a control signal $V_{CTRL}$ which represents a wanted voltage across the storage capacitor and the voltage $V_{STORE}$ from the storage capacitor $C_{STORE}$ to generate an error signal representing a difference between the control signal $V_{CTRL}$ and the voltage $V_{STORE}$. The comparator 66 receives the error signal and a reference signal, represented as a saw tooth signal to generate a pulse width modulation, PWM, signal. The switch control signal generator 68 receives the PWM signal to generate the clock signals φ1 and φ2 to control the two switches S1 and S2. The switch control signal generator 68 using inverters and delay stages to generate the clock signals φ1 and φ2 and tune switching instants of S1 and S2 in order to achieve non-overlapping switching.

The control circuitry together with the control signal $V_{CTRL}$ and the voltage $V_{STORE}$ form a first control loop which controls voltage stored in the storage capacitor to reach a value set by the control signal $V_{CTRL}$. The bandwidth of the control loop may be configurable to operate at different bandwidth in different operation modes. For example, the control loop bandwidth may be set high during start up in order to charge the storage capacitor $C_{STORE}$ quickly to a desired voltage $V_{STORE}$, and thereafter set to a lower value during normal operation in order to keep a more stable output current.

As shown in FIG. 6, there may be an optional filter 64 connected at the output of the error amplifier. The bandwidth of the filter 64 may be configurable such that the control loop bandwidth may be set by the configurable filter and switched between high and low values. The person skilled in the art will understand that other components in the loop may be used for bandwidth configuration, or more components may be added into the control loop for stability measures and/or used for bandwidth configuration.

Figure 7:
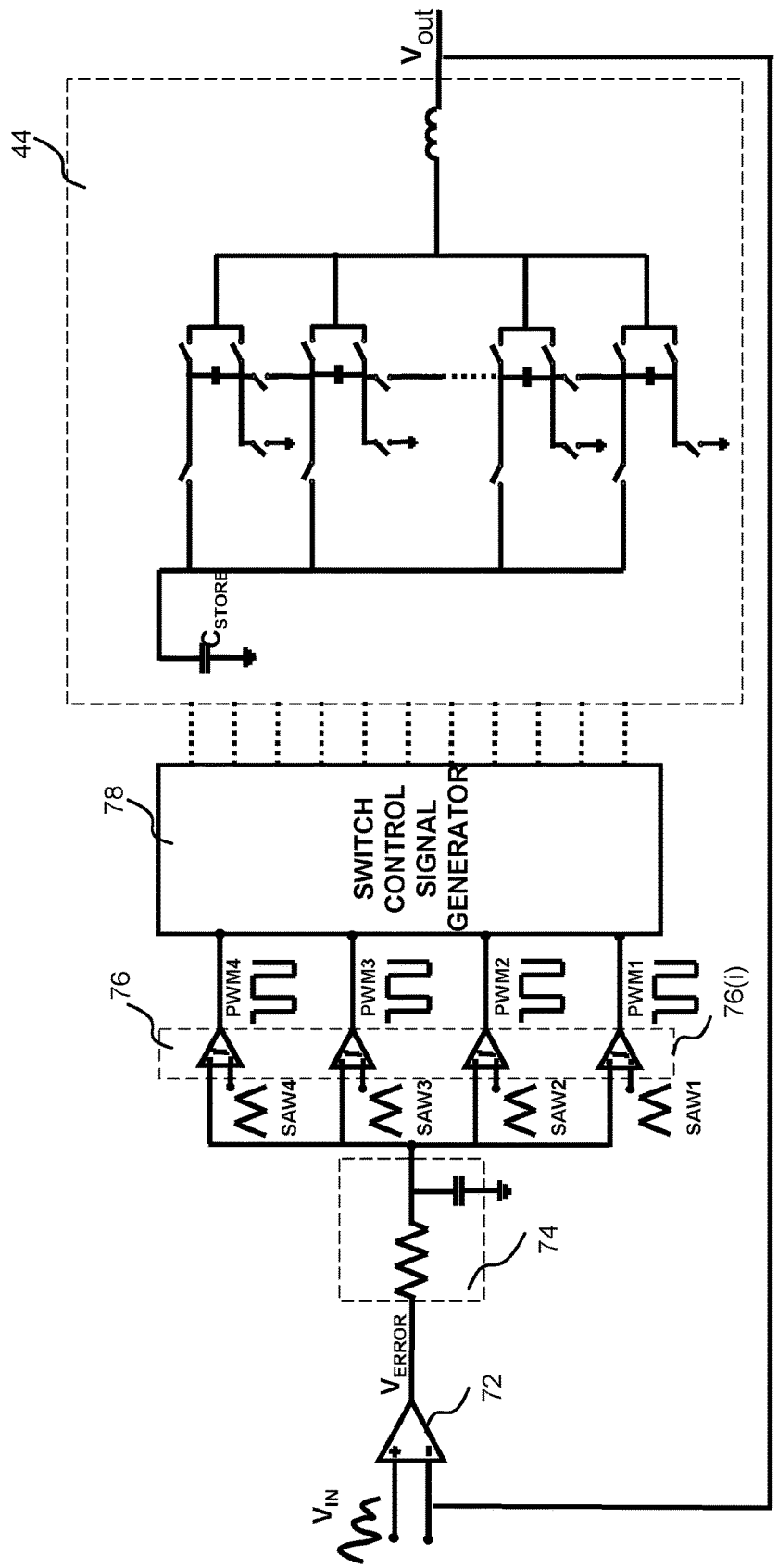
FIG. 7 is a schematic view of a multi-level switched capacitor modulator with control circuitry according an embodiment of the invention.

FIG. 7 shows a schematic view of an embodiment of the multi-level switched capacitor modulator 44 with control circuitry. According to the embodiment, the control circuitry, which is part of the control unit 46 in FIG. 4, comprises an error amplifier 72, a plurality of comparators 76(i), i=1, . . . N, and a switch control signal generator 78. The error amplifier 72 receives the input signal and the output voltage and outputs an error signal $V_{ERROR}$ representing a difference between the output voltage and the input signal. The plurality of comparators each receives the error signal generated by the error amplifier and a saw tooth signal associated with the comparator and generates a pulse width modulation signal. The switch control signal generator generates switch control signals to the multi-level switched capacitor modulator based on the pulse width modulation signals.

The control circuitry, the input signal, and the output voltage together form a second control loop. The second control loop controls switches of the multi-level switched capacitor modulator such that the output voltage follows the input signal. This is further described below with an example with reference to FIGS. 9 to 11.

Figure 8:
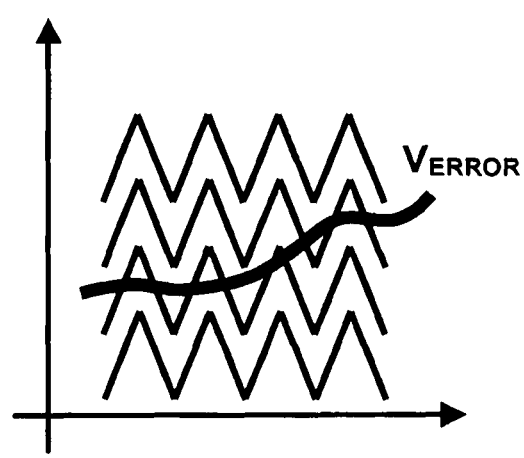
FIG. 8 is a diagram showing saw tooth signals.

As shown in FIG. 7, there may be an optional filter 74 connected at the output of the error amplifier. This can be used to limit the bandwidth, and thereby improve the stability of the second control loop. FIG. 8 shows saw tooth signals, which are used in some embodiments as inputs to the plurality of comparators. Notably, in FIG. 8, the saw tooth signals have different voltage levels (e.g different DC levels).

According to some embodiments, the switch control signal generator of the second control loop also comprises delay stages configured to tune switching instants of the switches in the multi-level switched capacitor modulator. The switching scheme can be derived from the error signal $V_{ERROR}$ in a predetermined way depending on the number of levels used.

Figure 9A:
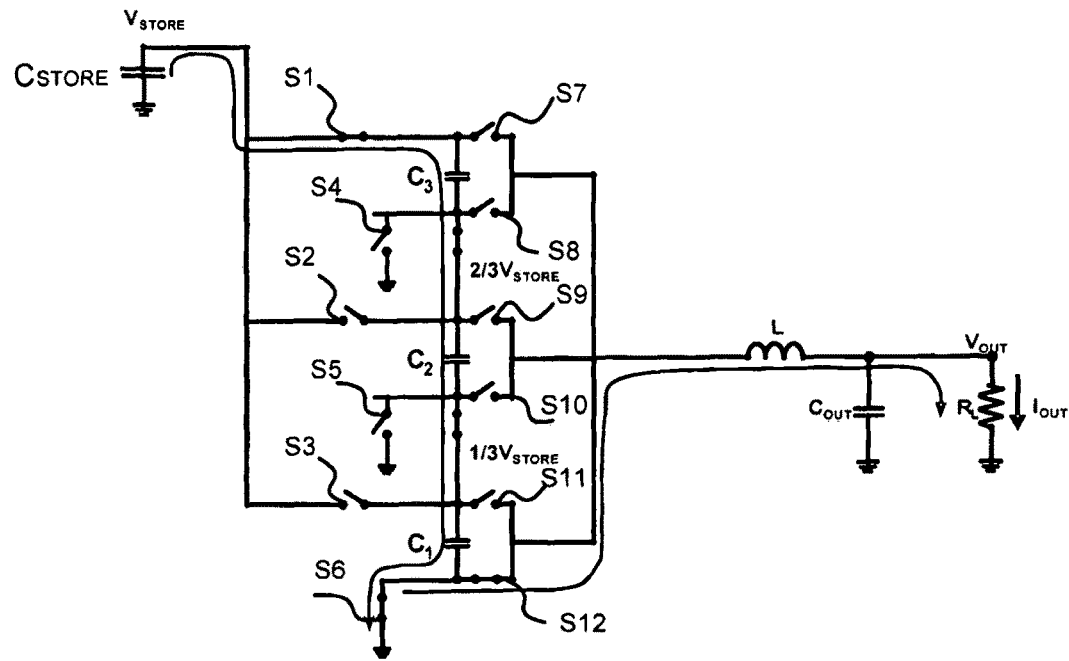
FIGS. 9 to 11 are schematic views showing different switch schemes for different output voltage ranges according an embodiment of the invention with a 3-level switched capacitor modulator.
Figure 9B:
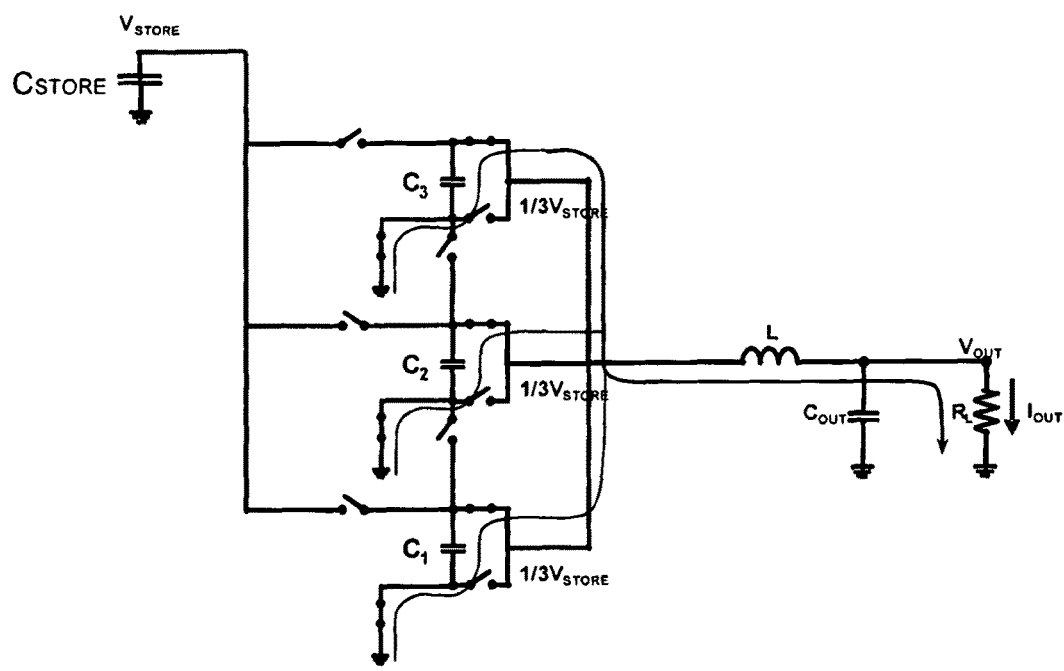
Figure 10A:
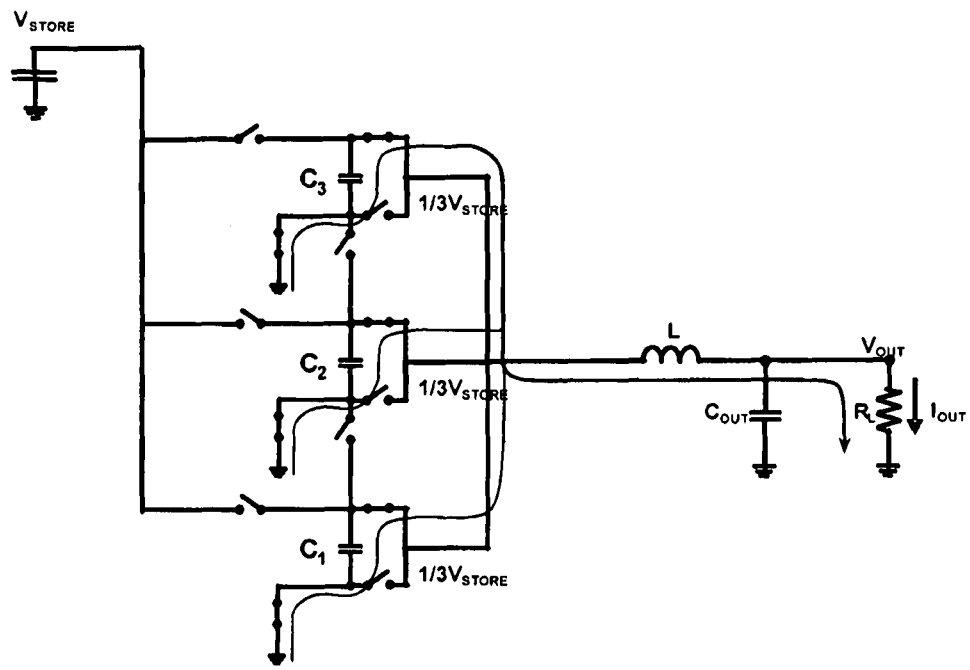
Figure 10B:
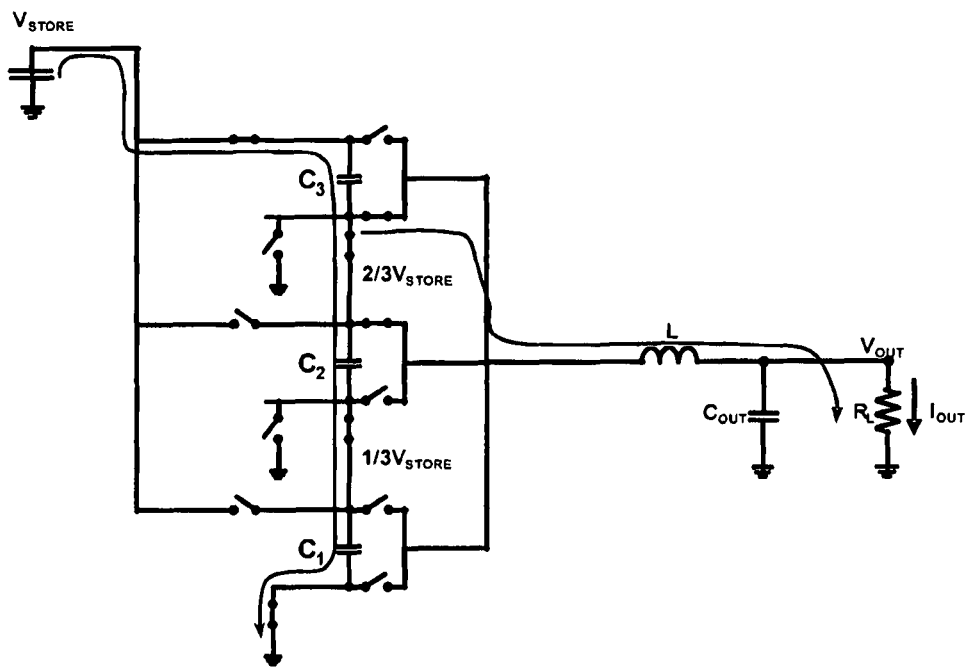
Figure 11A:
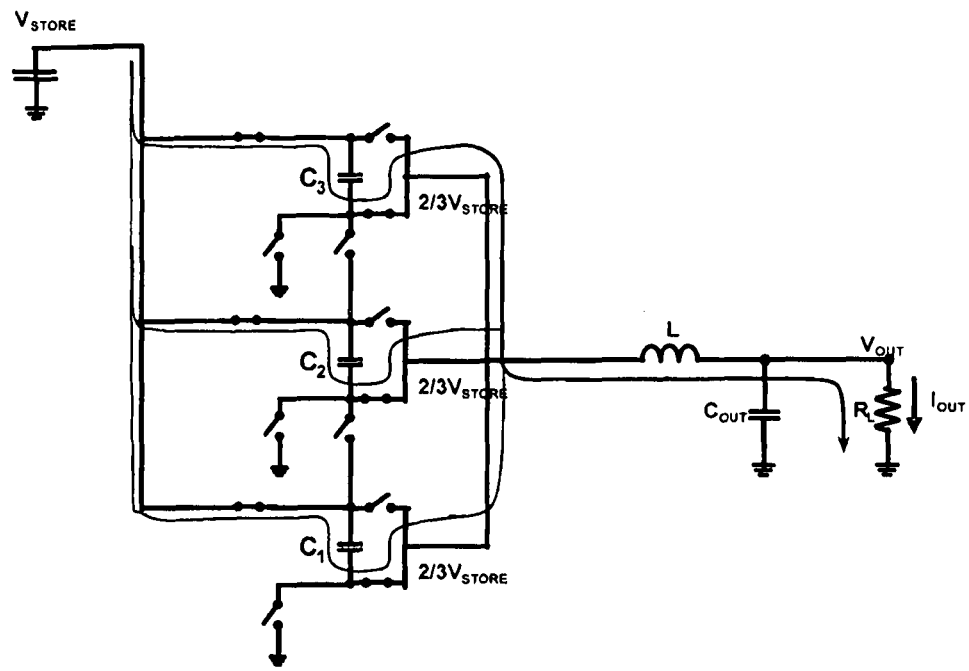
Figure 11B:
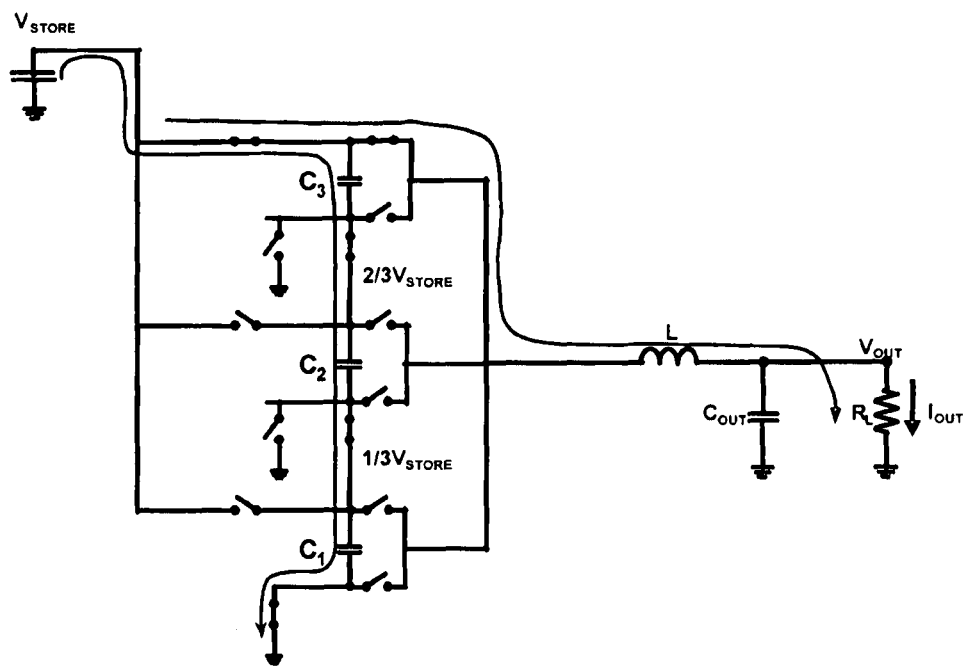

For example, FIGS. 9 to 11 show different switch schemes for a 3-level switched capacitor modulator according to an embodiment. FIGS. 9A and 9B show the generation for the first switching range, in which the output voltage of the modulator is switching between 0 and $1/3V_{STORE}$, FIGS. 10A and 10B show the generation for the second switching range, in which the output voltage is switching between $1/3V_{STORE}$ and $2/3V_{STORE}$, and FIGS. 11A and 11B show the generation for the third switching range, in which the output voltage is switching between $2/3V_{STORE}$ and $V_{STORE}$. To simplify, only in FIG. 9A, the switch numbers S1, S2 . . . S11 are assigned and noted to the switches. However the same switch number is assigned to the same switch in FIG. 9B and FIGS. 10-11 as well.

As an example, a switch control process to enable the output voltage tracking or following the input signal is hereby described, with reference to FIG. 7 in combination with FIGS. 9 to 11. The error amplifier 72 determines, or generates, a difference, represented as the error signal $V_{ERROR}$, between the input signal and the output voltage. The error signal $V_{ERROR}$ is then compared with reference DC voltages representing the limits for the different ranges to determine, or select, error signal ranges. After range selection, if the error signal range is in the first switching range, the error signal is compared with a first range saw-tooth signal SAW1 in comparator 76(1) and generates PWM1 signal to the switch control signal generator. In a first phase, illustrated in FIG. 9A, the switch control signal generator generates control signals to control the switches such that S1, S6 and S12 are closed, and S2-S5 and S7-S11 are open. In a second phase, illustrated in FIG. 9B, the switch control signal generator generates control signals to control the switches such that S4-S6, S7, S9 and S11 are closed, and S1-S3, S8, S10 and S12 are open.

If the error signal range is in the second switching range, the error signal is compared with a second range saw-tooth signal SAW2 in comparator 76(2) and generates PWM signal to the switch control signal generator. In a first phase, illustrated in FIG. 10A, the switch control signal generator generates control signals to control the switches such that S4, S5, S6, S7, S9 and S11 are closed, S1, S2, S3, S8, S10 and S12 are open. In a second phase, illustrated in FIG. 10B, the switch control signal generator generates control signals to control the switches such that S1, S6, S8 and S9 are closed, and S2-S5, S7 and S10-S12 are open.

If the error signal range is in the third switching range, the error signal is compared with a third range saw-tooth signal SAW3 in comparator 76(3) and generates PWM3 signal to the switch control signal generator. In a first phase, illustrated in FIG. 11A, the switch control signal generator generates control signals to control the switches such that S1, S2, S3, S8, S10 and S12 are closed, and S4, S5, S6, S7, S9 and S11 are open. In a second phase, illustrated in FIG. 11B, the switch control signal generator generates control signals to control the switches such that S1, S6 and S7 are closed, and S2-S5 and S8-S12 are open.

Figure 12:
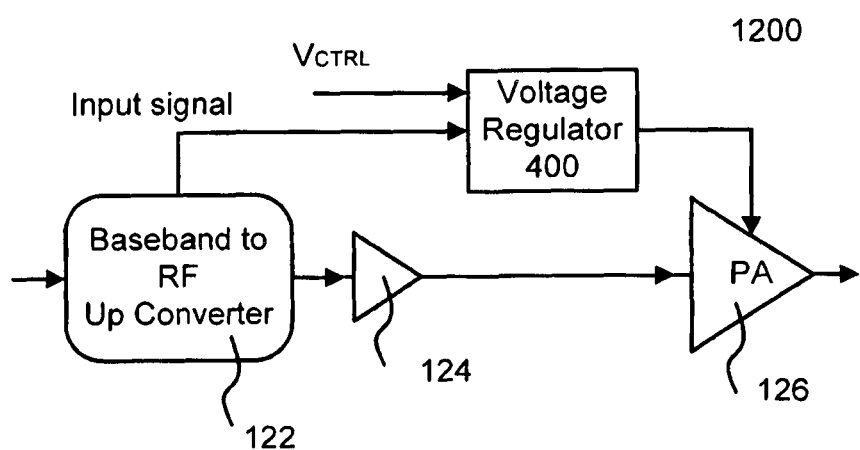
FIG. 12 is a block view of a power amplifier module including the voltage regulator according to an embodiment of the invention.

FIG. 12 shows an embodiment where the voltage modulator is used as power supply in a power amplifier (PA) envelope tracking application. Power control is important when the power amplifier is used in a wireless system, for example, comprising base station and mobile station, in order for the system to work properly and save power. When the PA is in a mobile station, its power may be controlled by a base station, by algorithms in the mobile station or by the user. In practice, the mobile station receives a control signal which indicates which power level will be used for the PA. As shown in FIG. 12, when the power level is changed, which may happen during start-up or during normal operation, the voltage modulator receives a control signal $V_{CTRL}$ representing which power level is used. The control signal is then compared with a voltage $V_{STORE}$ of the storage capacitor, in the switched voltage regulator of the voltage modulator and generates switch control signals such that the voltage on the storage capacitor reaches or is charged to the wanted voltage. The voltage modulator also receives an input signal which has a fast changing envelope, the high bandwidth multi-level switched capacitor modulator or the high speed modulator is taking care of the tracking as described above. In this way, the high efficiency switched voltage regulator delivers the average power, the switching speed can be low because it is not necessary to track the rapidly changing input signal, and thereby the switching losses are reduced.

Figure 14:
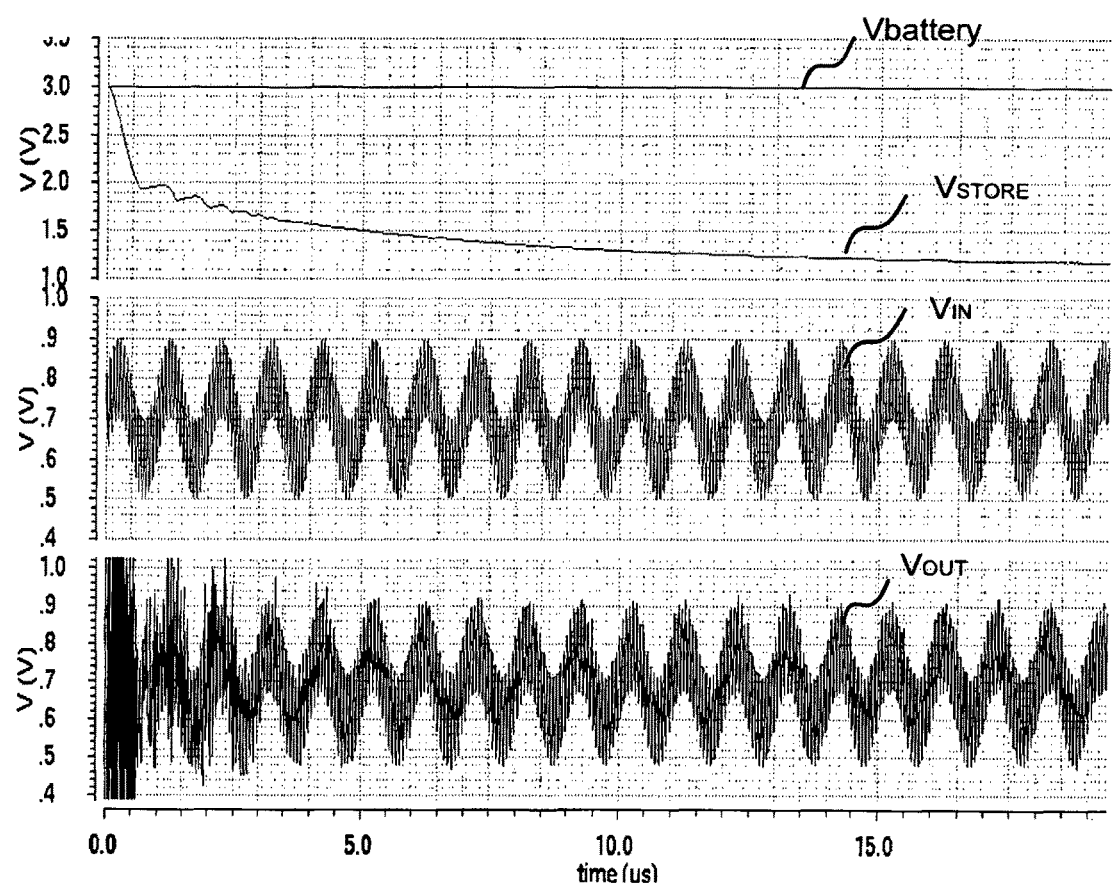
FIG. 14 is a diagram with simulation results showing adaptive step size capability of the voltage regulator according to an embodiment of the invention.

The voltage $V_{STORE}$ stored on the storage capacitor can be adjusted or adapted by the control signal as described above and contributes to an advantageous feature of the invention. FIG. 14 is a diagram with simulation results showing adaptive capability of an embodiment of the voltage regulator. When the input signal is between 0.5V and 0.9V, $V_{CTRL}$ is set to 1V and $V_{STORE}$ is adapted to 1V by the control loop. Adapting the $V_{STORE}$ voltage to the power level needed as described above will keep a ratio between the input signal and the output voltage (or current) ripple constant while keeping the high efficiency. For comparisons, simulations have been done for a relatively high $V_{STORE}$=4.2 V ($V_{CTRL}$=4.2 V) and a relatively low $V_{STORE}$=1 V ($V_{CTRL}$=1V) for the input signal around 3.5V and 0.8V, respectively. The corresponding output voltage ripples (peak-to-peak) are 75.8 mV and 16.6 mV, respectively. As one can see, the output voltage ripple is decreased when the $V_{STORE}$ can be adjusted or adapted according to the power level. However, the skilled person should understand that even if one keep a relatively high $V_{STORE}$ and don't adapt it, the high speed modulator will still track the input signal envelope.

The PA shown in FIG. 12 is one embodiment of the load $R_L$ shown in FIGS. 4 to 6, where an impedance of the PA or $R_L$ may be variable, or varied over time. Further, the load $R_L$ may represent any electronic devices, wire or wireless transceiver etc., to which the voltage modulator according to embodiments of the present invention may be used to provide a supply voltage.

Figure 13:
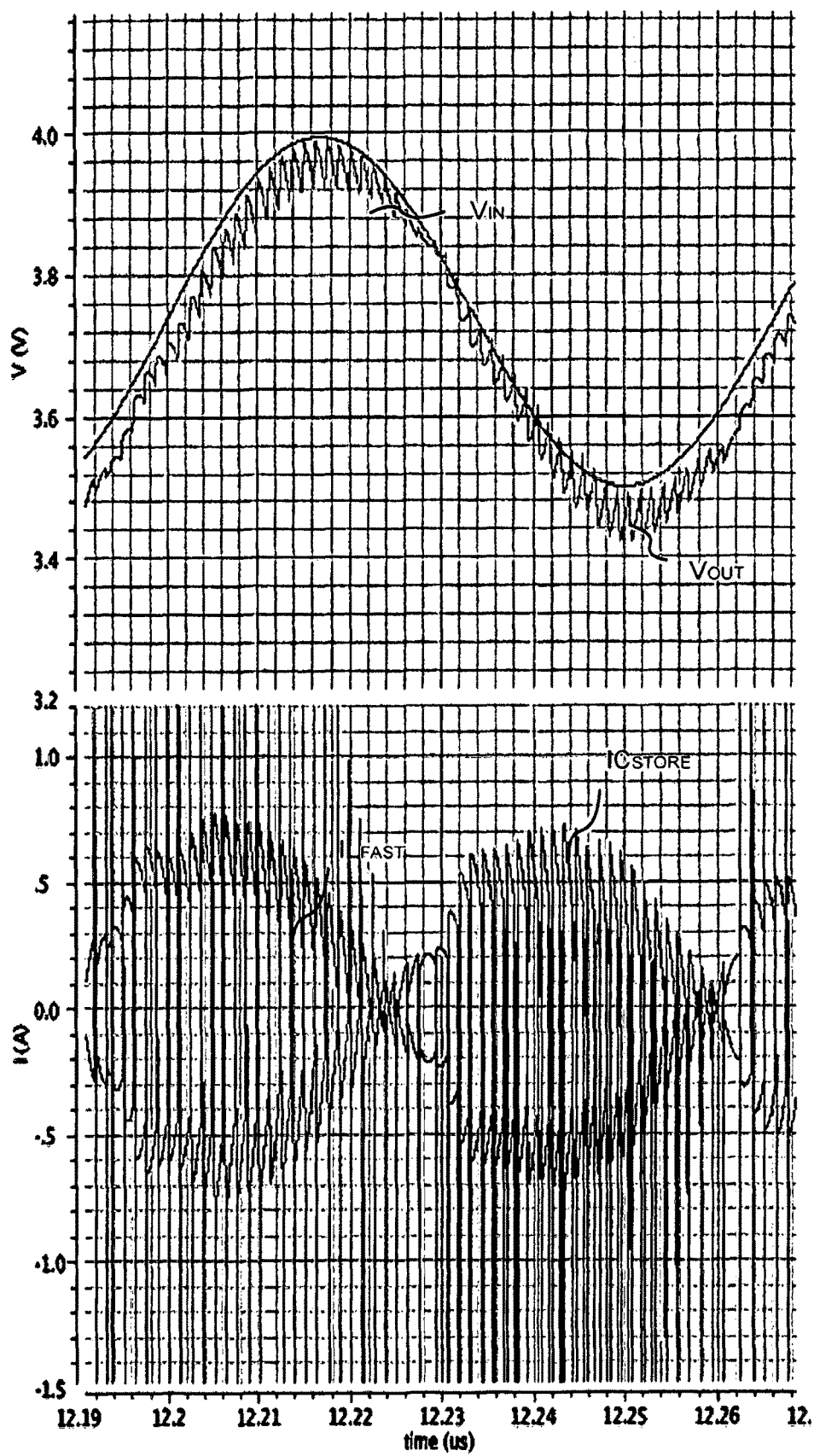
FIG. 13 is a diagram with simulation results showing current reuse capability of the voltage regulator according to an embodiment of the invention.

Although FIGS. 9-11 indicate that the current is flowing from the storage capacitor to the load, the current may flow in opposite detection from the output to the storage capacitor, as mentioned at the beginning of the detailed description. The current is thus reused, whereby the efficiency is improved. The mechanism of current reuse is hereby explained with reference to the simulation results shown in FIG. 13. The simulation results come from a simulation example with a 4-level high speed switched capacitor modulator using a sinusoidal input signal, in which the input signal frequency is 15 MHz, the switching frequency of the high speed switched capacitor modulator is 800 MHz, and the switching frequency of the high efficiency switched voltage regulator is 25 MHz. In FIG. 13, plot $V_{IN}$ shows the input signal, plot $V_{OUT}$ shows the output signal, plot $I_{L_{FAST}}$ shows the current through the inductor $L_{FAST}$ and plot $I_{C_{STORE}}$ shows the current through the storage capacitor $C_{STORE}$. Clearly the current direction through the storage capacitor $C_{STORE}$ is changing during the input signal period, charging and discharging the storage capacitor, as described below:

Assume that the output voltage is relatively low, and the input signal is relatively high. In order to track the input signal, the output voltage from the voltage modulator needs to rise and the output current needed is relatively large. The current delivered by the efficient voltage regulator is not enough. That is, the output current needed is larger than the current delivered by the switched voltage regulator. The storage capacitor is then discharged to deliver the extra current needed for the output.

Assume that the output voltage is relatively high, and the input signal is relatively low. In order to track the input signal, the output voltage from the voltage modulator needs to drop and in turn, the current delivered by the efficient voltage regulator is larger than needed. The storage capacitor will sink the extra current and is charged. In this way, the power efficiency is improved. For this specific simulation, the power efficiency is 89%.

The speed of the voltage modulator according to an embodiment of the present invention is comparable to the multi-level supply modulator shown in FIG. 3, but with the advantage that the multi-level supply modulator is off-loaded by the high efficiency voltage regulator. As the currents through the high efficiency regulator are smaller, the switches may be made smaller which in turn means lower switching losses.

Compared with a simple step-down regulator/modulator, switching between multiple voltage levels, i.e. levels closer to the wanted output voltage, the output current ripple becomes smaller, which means that a smaller inductor $L_{FAST}$ may be implemented and thus the bandwidth of the modulator will be higher.

For the prior art hybrid modulator shown in FIG. 2, although the linear modulator may be of class-B and relatively efficient, the current spent in the efficient modulator during rapid, falling voltage transitions is wasted because the linear modulator needs to sink this current to ground in order to lower the output voltage. In embodiments of the present invention, this current is instead used to charge the storage capacitor and can be reused for the rising transitions in the voltage modulator according to an embodiment of the present invention, as illustrated in FIG. 13.

Figure 15:
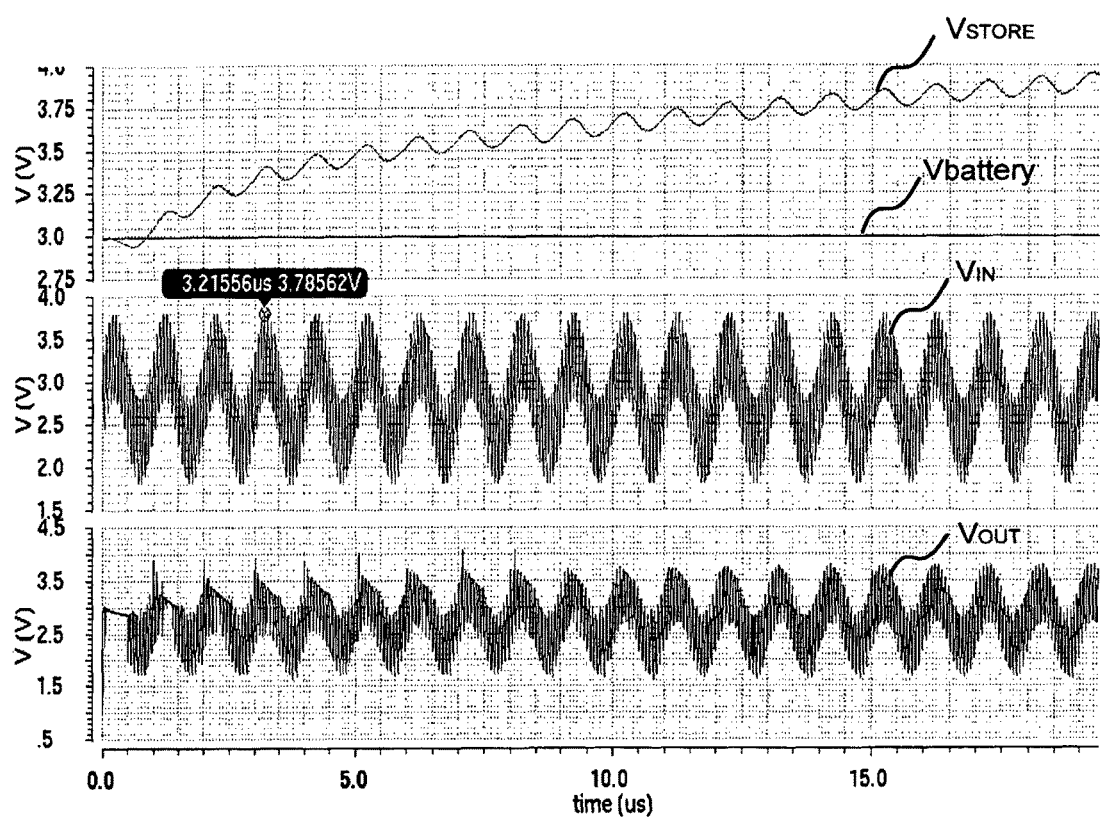
FIG. 15 is a diagram with simulation results showing step-up capability of the voltage regulator according to an embodiment of the invention.

Yet another advantage is that the voltage modulator according to an embodiment of the invention resembles a charge pump and has a built in ability to generate output voltages higher than the battery voltage, which may be beneficial as there is less or no need for step-up converters between the battery and the modulator. As long as the high efficiency regulator is able to deliver the average power (plus losses) to the load there is a possibility to boost the $V_{STORE}$ voltage to a value higher than the input signal peaks with the aid of the current reuse mechanism. FIG. 15 shows a simulation example where the battery voltage is 3.0 V, the input signal average voltage is 2.8 V and the input signal peaks (1 MHz and 15 MHz signals overlaid) may reach 3.8 V. As shown in FIG. 15, the $V_{STORE}$ may reach 3.8V, if the high efficiency regulator does not lower its output current too much during input signal falling transitions in order for the high speed modulator to get enough current to charge the storage capacitor.

The present invention has been described above with reference to specific embodiments. However, other embodiments than the above described are possible within the scope of the invention. The different features and components of the embodiments may be combined in other combinations than those described. The scope of the invention is only limited by the appended patent claims.

The invention claimed is:

1. A voltage modulator, comprising:
a multi-level switched capacitor modulator;
a switched voltage regulator;
an input node to receive an input signal and an output node to output a voltage;
wherein an output of the multi-level switched capacitor modulator and an output of the switched voltage regulator are both connected to the output node of the voltage modulator; and
a control circuit configured to control the switched voltage regulator and the multi-level switched capacitor modulator such that the output voltage follows the input signal.

2. The voltage modulator of claim 1:
wherein the multi-level switched capacitor modulator comprises a storage capacitor; and
wherein the storage capacitor is configured to be:
charged when an output current is smaller than a current delivered by the switched voltage regulator; and
discharged when the output current is larger than the current delivered by the switched voltage regulator.

3. The voltage modulator of claim 2, wherein the control circuit comprises a first control loop configured to control switches of the switched voltage regulator such that voltage stored in the storage capacitor reaches a value set by a control signal.

4. The voltage modulator of claim 3, wherein the first control loop is configurable to operate at different bandwidths in different operation modes.

5. The voltage modulator of claim 3, wherein the first control loop comprises:
a first error amplifier configured to:
receive a voltage signal from the storage capacitor and the control signal; and
output an error signal representing a difference between the voltage signal and the control signal;
a comparator configured to receive the error signal generated by the first error amplifier and a saw tooth signal to generate a pulse width modulation signal; and
a switch control signal generator configured to generate switch control signals to the switched voltage regulator based on the pulse width modulation signal generated by the comparator of the first control loop.

6. The voltage modulator of claim 5, wherein the switch control signal generator of the first control loop comprises inverters and delay stages configured to tune switching instants such that non-overlapping switching is achieved.

7. The voltage modulator of claim 2, wherein the control circuit comprises a second control loop configured to control switches of the multi-level switched capacitor modulator such that the output voltage follows the input signal.

8. The voltage modulator of claim 7, wherein the second control loop comprises:
a second error amplifier configured to:
receive the input signal and the output voltage; and
output an error signal representing a difference between the output voltage and the input signal;
a plurality of comparators, each configured to receive the error signal generated by the second error amplifier and a saw tooth signal associated with the comparator and to generate a pulse width modulation signal;
a switch control signal generator configured to generate switch control signals to the multi-level switched capacitor modulator based on the pulse width modulation signals generated by the plurality of comparators of the second control loop; and
wherein the saw tooth signals associated with the different comparators have different DC levels.

9. The voltage modulator of claim 8, wherein the switch control signal generator of the second control loop comprises delay stages configured to tune switching instants.

10. The voltage modulator of claim 1, wherein the switched voltage regulator is a buck or boost converter.

11. The voltage modulator of claim 1, further comprising a load connected to the output node, wherein an impedance of the load is variable.

12. The voltage modulator of claim 1, wherein the multi-level switched capacitor modulator is a charge-pump based multi-level switched capacitor modulator.

13. The voltage modulator of claim 1, wherein the multi-level switched capacitor modulator comprises a multi-level charge pump.

14. An electronic device, comprising:
a voltage modulator; and
wherein the voltage modulator comprises:
a multi-level switched capacitor modulator;
a switched voltage regulator;
an input node to receive an input signal and an output node to output a voltage;
wherein an output of the multi-level switched capacitor modulator and an output of the switched voltage regulator are both connected to the output node of the voltage modulator; and
a control circuit configured to control the switched voltage regulator and the multi-level switched capacitor modulator such that the output voltage follows the input signal.

15. A wireless transceiver, comprising
a voltage modulator; and
wherein the voltage modulator comprises:
a multi-level switched capacitor modulator;
a switched voltage regulator;
an input node to receive an input signal and an output node to output a voltage;
wherein an output of the multi-level switched capacitor modulator and an output of the switched voltage regulator are both connected to the output node of the voltage modulator; and
a control circuit configured to control the switched voltage regulator and the multi-level switched capacitor modulator such that the output voltage follows the input signal.

16. A power amplifier module, comprising:
a voltage modulator; and
wherein the voltage modulator comprises:
a multi-level switched capacitor modulator;
a switched voltage regulator;

an input node to receive an input signal and an output node to output a voltage;

wherein an output of the multi-level switched capacitor modulator and an output of the switched voltage regulator are both connected to the output node of the voltage modulator; and a control circuit configured to control the switched voltage regulator and the multi-level switched capacitor modulator such that the output voltage follows the input signal.

17. A method of generating an output voltage to follow a input signal, the method comprising:

combining an output of a switched voltage regulator and an output of a multi-level switched capacitor modulator to generate the output voltage;

controlling, by a first control loop, switches of the switched voltage regulator such that a voltage stored in a storage capacitor of the multi-level switched capacitor modulator reaches a value set by a control signal; and controlling, by a second control loop, switches of the multi-level switched capacitor modulator such that the output voltage follows the input signal.

18. The method of claim 17, wherein the multi-level switched capacitor modulator is a charge-pump based multi-level switched capacitor modulator.

19. The method of claim 17, wherein the multi-level switched capacitor modulator comprises a multi-level charge pump.

* * * * *